United States Patent
Kondo

(10) Patent No.: US 6,943,050 B2
(45) Date of Patent: Sep. 13, 2005

(54) METHOD FOR MAKING SEMICONDUCTOR DEVICE, SEMICONDUCTOR ELEMENT COMPOSITE, ELECTRO-OPTICAL APPARATUS, AND ELECTRONIC SYSTEM

(75) Inventor: Takayuki Kondo, Suwa (JP)

(73) Assignee: Seiko Epson Corporation, Tokyo (JP)

(*) Notice: Subject to any disclaimer, the term of this patent is extended or adjusted under 35 U.S.C. 154(b) by 3 days.

(21) Appl. No.: 10/601,704

(22) Filed: Jun. 24, 2003

(65) Prior Publication Data

US 2004/0048447 A1 Mar. 11, 2004

(30) Foreign Application Priority Data

Jul. 11, 2002 (JP) ........................................ 2002-202466

(51) Int. Cl.$^7$ ............................................. H01L 21/306
(52) U.S. Cl. ............................. 438/46; 438/47; 438/739
(58) Field of Search .......................... 438/46, 47, 739, 438/FOR 289; 257/E21.123

(56) References Cited

U.S. PATENT DOCUMENTS

| | | | | |
|---|---|---|---|---|
| 4,846,931 A | * | 7/1989 | Gmitter et al. ............... | 438/26 |
| 5,073,230 A | | 12/1991 | Maracas et al. | |
| 5,244,818 A | | 9/1993 | Jokerst et al. | |
| 5,256,580 A | * | 10/1993 | Gaw et al. ..................... | 438/39 |
| 5,286,335 A | | 2/1994 | Drabik et al. | |
| 5,300,788 A | * | 4/1994 | Fan et al. ...................... | 257/13 |
| 5,344,517 A | * | 9/1994 | Houlding ..................... | 156/236 |
| 5,401,983 A | * | 3/1995 | Jokerst et al. ................ | 257/82 |
| 5,453,405 A | * | 9/1995 | Fan et al. ..................... | 438/34 |
| 5,465,009 A | | 11/1995 | Drabik et al. | |
| 5,827,751 A | | 10/1998 | Nuyen | |
| 6,033,995 A | | 3/2000 | Muller | |
| 6,214,733 B1 | | 4/2001 | Sickmiller | |
| 6,576,564 B2 | * | 6/2003 | Agarwal ...................... | 438/758 |
| 6,577,785 B1 | * | 6/2003 | Spahn et al. .................. | 385/22 |
| 6,706,546 B2 | * | 3/2004 | Yoshimura et al. ........... | 438/31 |
| 2002/0028045 A1 | * | 3/2002 | Yoshimura et al. ........... | 385/50 |
| 2002/0177246 A1 | * | 11/2002 | Hang et al. .................... | 438/22 |
| 2004/0113225 A1 | * | 6/2004 | Ogihara ........................ | 257/500 |
| 2004/0130015 A1 | * | 7/2004 | Ogihara et al. .............. | 257/678 |

FOREIGN PATENT DOCUMENTS

| | | |
|---|---|---|
| JP | A 57-51781 | 3/1982 |
| JP | A 59-194393 | 11/1984 |
| JP | A 63-70257 | 3/1988 |
| JP | A 63-175860 | 7/1988 |
| JP | A 2-135359 | 5/1990 |
| JP | A 2-135361 | 5/1990 |
| JP | A 2-209988 | 8/1990 |
| JP | A 3-37992 | 2/1991 |
| JP | A 3-152184 | 6/1991 |
| JP | A 6-151720 | 5/1994 |
| JP | A 6-151946 | 5/1994 |

OTHER PUBLICATIONS

Yablonovitch, .E., et al, "Extreme Selectivity in the lift–off of epitaxial GaAs films", Appl.Phys.Lett.51 (26), Dec. 28, 1987, pp. 2222–2224.*

* cited by examiner

*Primary Examiner*—George Fourson
(74) *Attorney, Agent, or Firm*—Oliff & Berridge, PLC

(57) ABSTRACT

The invention provides a method of fabricating a semiconductor device in which a more satisfactory selective etching ratio is ensured when AlGaAs is used for a layer provided with a semiconductor element, and provides a semiconductor element composite, an electro-optical apparatus, and an electronic system, each including the semiconductor device fabricated by the method. A method of fabricating a semiconductor device includes: forming a functional layer provided with a semiconductor element on a substrate with a sacrificial layer therebetween; and detaching the functional layer from the substrate by etching the sacrificial layer. The sacrificial layer is composed of an N-type $Al(x1)Ga(1-x1)$ As layer and the functional layer is composed of an $Al(x2)Ga(1-x2)As$ semiconductor layer, where $x1>x2$. Using hydrochloric acid or hydrofluoric acid with a concentration of 0.01% to 5% by weight as an etchant, the sacrificial layer is etched while the sacrificial layer is being irradiated with light.

13 Claims, 14 Drawing Sheets

METHOD FOR MAKING SEMICONDUCTOR DEVICE, SEMICONDUCTOR ELEMENT COMPOSITE, ELECTRO-OPTICAL APPARATUS, AND ELECTRONIC SYSTEM

BACKGROUND OF THE INVENTION

1. Field of Invention

The present invention relates to a method of fabricating a semiconductor device, and to a semiconductor element composite, an electro-optical apparatus, and an electronic system, each including the semiconductor device fabricated by the method.

2. Description of Related Art

The related art includes techniques of forming a semiconductor element on a substrate composed of a different material. For example, a surface-emitting laser (VCSEL), photodiode (PD), or high electron mobility transistor (HEMT) composed of gallium arsenide (GaAs), aluminum gallium arsenide (AlGaAs), or the like is disposed on a silicon semiconductor substrate, and in a liquid crystal display (LCD), silicon microtransistors, instead of thin-film transistors (TFTs), for the individual pixels are bonded to a glass substrate.

One example of the integrated circuit provided with semiconductors composed of different materials is an optoelectronic integrated circuit (OEIC). The optoelectronic integrated circuit includes an optical input/output device, and although signal processing is performed using electrical signals in the integrated circuit, input/output with the outside of the integrated circuit is performed using optical signals.

In computers, with the miniaturization of the internal structure of the integrated circuit, the operating speed (operation clock) in the CPU is improving year by year. However, in the related art, the signal transmission speed in the bus is almost reaching the limit, which is a bottleneck in the computer processing speed. If signal transmission in the bus is performed using optical signals, it becomes possible to remarkably increase the limit of the computer processing speed. In order to achieve this, small photodetectors/light-emitting elements must be built into the integrated circuit composed of silicon.

However, silicon cannot emit light because it is an indirect gap semiconductor. Therefore, silicon and a semiconductor light-emitting element composed of a material that is different from silicon must be combined to construct an integrated circuit.

One example of a potential semiconductor light-emitting element is a surface-emitting laser (VCSEL) composed of a compound semiconductor, such as gallium arsenide (GaAs) or aluminum gallium arsenide (AlGaAs). However, since such a surface-emitting laser has poor lattice matching with silicon, it is extremely difficult to form the surface-emitting laser directly on a silicon integrated circuit by a semiconductor process, such as epitaxy.

The surface-emitting laser is usually formed on a gallium arsenide substrate. Accordingly, the related art includes a method in which the surface-emitting laser formed on the substrate is formed into a chip, and the chip is mechanically mounted on a silicon integrated circuit board, thereby integrating an electrical signal transmission circuit and an optical signal transmission circuit with each other.

SUMMARY OF THE INVENTION

When the surface-emitting laser is fabricated, an aluminum gallium arsenide layer is formed as an epitaxial layer on a gallium arsenide substrate, and the aluminum gallium arsenide layer is processed. In order to form a semiconductor element, such as the surface-emitting laser, a so-called "epitaxial lift-off process" has been developed in which a sacrificial layer is formed between the substrate and the semiconductor element, and the semiconductor element is detached from the substrate by etching the sacrificial layer.

For example, in aluminum gallium arsenide with a composition of Al(x)Ga(1-x)As, as the Al content increases and x becomes closer to 1, the etching rate with respect to HF (hydrofluoric acid) or HCl (hydrochloric acid) increases. By using aluminum gallium arsenide as a sacrificial layer in view of such a property, the semiconductor element can be detached from the substrate by the epitaxial lift-off process.

However, if a layer for forming the semiconductor element is composed of aluminum gallium arsenide, in the composition Al(x)Ga(1-x)As of the sacrificial layer, at most x=1.0, i.e., merely AlAs is available. Therefore, as the Al content increases in the layer for forming the semiconductor element, it becomes difficult to ensure a satisfactory selective etching ratio. As a result, the semiconductor element on the substrate is damaged by etching. For example, when a surface-emitting laser is formed as the semiconductor element, since a layer constituting the surface-emitting laser is partially composed of a material with an Al content x of approximately 0.9, the problem becomes conspicuous.

The present invention addresses the above and/or other circumstances, and provides a method of fabricating a semiconductor device in which a more satisfactory selective etching ratio is ensured particularly when AlGaAs is used for a layer (functional layer) provided with a semiconductor element, thereby reducing or preventing damage to the semiconductor element. The invention also provides a semiconductor element composite, an electro-optical apparatus, and an electronic system, each including the semiconductor device obtained by the fabrication method.

In order to address or achieve the above, in one aspect of the present invention, a method of making a semiconductor device includes: forming a functional layer provided with a semiconductor element on a substrate with a sacrificial layer therebetween; and detaching the functional layer from the substrate by etching the sacrificial layer. The sacrificial layer is composed of an N-type Al(x1)Ga(1-x1)As layer; the functional layer is composed of an Al(x2)Ga(1-x2)As semiconductor layer, where x1>x2; hydrochloric acid or hydrofluoric acid with a concentration of 0.01% to 5% by weight is used as an etchant for the sacrificial layer; and the sacrificial layer is etched by the etchant while the sacrificial layer is being irradiated with light.

In accordance with the method, for example, even when a layer having a high Al content is used as the functional layer provided with the semiconductor element, by using, as the sacrificial layer, an N-type Al(x1)Ga(1-x1)As layer with a higher Al content and a lower Ga content as compared with the functional layer, and by etching the sacrificial layer using dilute hydrochloric acid as the etchant while the sacrificial layer is being irradiated with light, a sufficiently high selective etching ratio is ensured. Consequently, an epitaxial lift-off process can be performed satisfactorily without damaging the semiconductor element.

In the method of making the semiconductor device, preferably, x1 in the sacrificial layer composed of the N-type Al(x1)Ga(1-x1)As layer and x2 in the functional layer composed of the Al(x2)Ga(1-x2)As semiconductor layer satisfy the relationship x1−x2≧0.1.

In the method of making the semiconductor device, x1 in the sacrificial layer composed of the N-type Al(x1)Ga(1-x1)As layer is preferably 0.95 or more, and more preferably 1.0.

Consequently, a high selective etching ratio is ensured and damage to the semiconductor element is more reliably prevented.

Preferably, the method of making the semiconductor device further includes: attaching a film to the functional layer formed on the substrate, and the functional layer provided with the semiconductor element is detached from the substrate in that state.

Consequently, it is possible to detach only the functional layer provided with the semiconductor element in a microtile shape from the substrate, and the detached functional layer can be handled while being mounted on the film. Therefore it is possible to select the semiconductor element individually, and the selected semiconductor element can be bonded to a second substrate. The size of the semiconductor element to be handled can be decreased compared to the size in the related art mounting technique.

In the method of making the semiconductor device, preferably, the semiconductor element includes at least one of a light-emitting diode, a surface-emitting laser, a photodiode, a high electron mobility transistor, an inductor, a capacitor, a resistor, and a heterojunction bipolar transistor.

Preferably, the method of making the semiconductor device further includes forming an isolating groove in the functional layer, and the sacrificial layer is etched in that state to detach the functional layer from the substrate. Preferably, the isolating groove is formed by either dry etching or wet etching.

Consequently, with respect to the functional layer provided with the semiconductor element, the entire area of the functional layer except for the region in which the isolating groove is formed can be used as the semiconductor element.

Preferably, the isolating groove has a depth that reaches at least the sacrificial layer. In such a case, preferably, the sacrificial layer is etched by placing the etchant into the isolating groove to detach the functional layer from the substrate.

Consequently, by placing the etchant into the isolating groove, the etchant can be fed to the sacrificial layer through the isolating groove, and the sacrificial layer can be etched reliably.

Preferably, the method of making the semiconductor device further includes: bonding the detached functional layer provided with the semiconductor element to a second substrate that is different from the substrate.

Preferably, the second substrate that is different from the substrate is composed of any one of silicon, quartz, sapphire, metal, ceramic, and plastic films.

Preferably, the method for making the semiconductor device further includes connecting the semiconductor element provided on the functional layer, which is bonded to the second substrate that is different from the substrate, to a circuit disposed on the second substrate.

Consequently, by forming a circuit on the second substrate that is different from the substrate and by electrically connecting the circuit to the semiconductor element of the functional layer, it is possible to fabricate a multifunctional semiconductor device.

In another aspect of the present invention, a semiconductor element composite includes a semiconductor device fabricated by any one of the methods described above.

Since the semiconductor element composite includes the semiconductor device including a semiconductor element formed satisfactorily by an epitaxial lift-off process without any damage, high reliability is ensured.

In another aspect of the present invention, an electro-optical apparatus includes a semiconductor device fabricated by any one of the methods described above. Preferably, the electro-optical apparatus includes a plurality of scanning lines and a plurality of data lines arrayed in a matrix, switching means connected to the scanning lines and the data lines, and pixel electrodes connected to the switching means, or includes a light emitting element.

Since the electro-optical apparatus includes the semiconductor device including a semiconductor element formed satisfactorily by an epitaxial lift-off process without any damage, high reliability is ensured.

In another aspect of the present invention, an electronic system includes any one of the electro-optical apparatuses described above. Since the electronic system includes the electro-optical apparatus, high reliability is ensured.

DETAILED DESCRIPTION OF PREFERRED EMBODIMENTS

An exemplary embodiment of a method for making a semiconductor device of the present invention is described below with reference to the drawings. Additionally, although a case in which a compound semiconductor device (compound semiconductor element) acting as a surface-emitting laser is bonded onto a silicon LSI chip is described in this exemplary embodiment, the present invention is not limited thereto. The present invention is applicable to any type of semiconductor device or LSI chip.

<Step 1>

Figure 1:
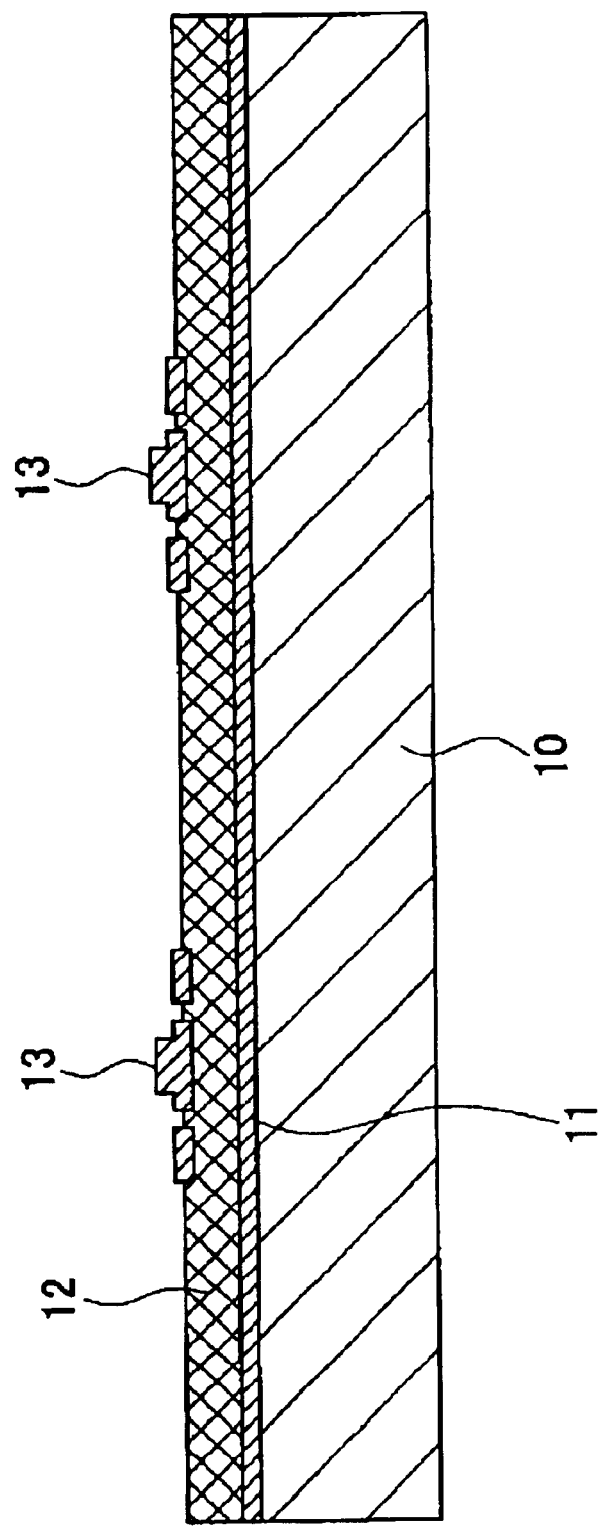
FIG. 1 is a sectional side elevational view of a substantial part which shows step 1 in a method of fabricating a semiconductor device in an exemplary embodiment of the present invention.

In step 1, first, as shown in FIG. 1, a substrate 10 composed of a gallium arsenide (GaAs) compound semiconductor is prepared. Next, an epitaxial film (not shown in the drawing) is formed on the surface of the substrate 10 by epitaxial growth. Herein, as the bottom layer of the epitaxial film, a sacrificial layer 11 is formed at a thickness of approximately several hundred nanometers. In this embodiment, the sacrificial layer 11 is an N-type Al(x1)Ga(1-x1)As layer (aluminum gallium arsenide layer). When the sacrificial layer 11 is formed as an N-type layer, Si (silicon), Se (selenium), or the like is used as a dopant.

A functional layer 12 with a thickness of approximately 1 to 10 (20) $\mu$m is formed on the sacrificial layer 11, and semiconductor devices (semiconductor elements) 13 which act as surface-emitting lasers (VCSELs) are formed on the functional layer 12. The functional layer 12 is formed by depositing a plurality of epitaxial layers, and is basically composed of an Al(x2)Ga(1-x2)As (aluminum gallium arsenide) semiconductor layer. In particular, the semiconductor layer constituting the functional layer 12 and the sacrificial layer 11 are formed so that x1 and x2 in the compositions have different values. Specifically, the relationship x1>x2 is satisfied, i.e., the Al content of the sacrificial layer 11 is higher than that of the functional layer 12. When the semiconductor device (semiconductor element) 13 is a surface-emitting laser, for example, x2 is approximately 0.9 in a layer constituting the DBR (Distributed Bragg Reflector) thereof. Consequently, x1 is set at 0.95 or more, and preferably 1.0. In this exemplary embodiment, x2=1.0, i.e., the N-type Al(x1)Ga(1-x1)As layer constituting the sacrificial layer 11 is an N-type AlAs layer (aluminum arsenide layer).

As described above, the semiconductor device 13 is formed by depositing a plurality of epitaxial layers, and electrodes are also formed therein. An operation test is also conducted.

<Step 2>

Figure 2:
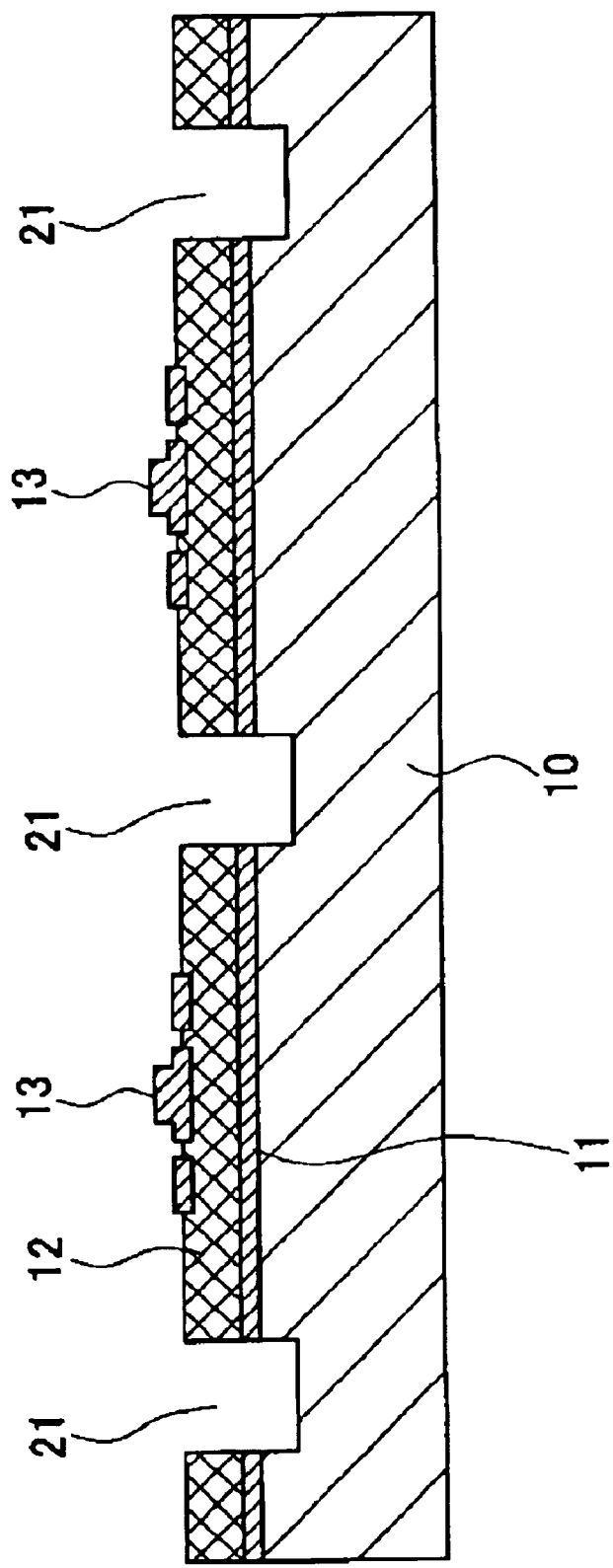
FIG. 2 is a sectional side elevational view of a substantial part which shows step 2 in the fabrication method in the exemplary embodiment.

In step 2, as shown in FIG. 2, isolating grooves 21 are formed in the functional layer 12 so as to isolate the individual semiconductor devices 13 from each other. The isolating groove 21 has a depth that reaches at least the sacrificial layer 11. For example, each of the width and the depth of the isolating groove 21 is set at 10 to several hundred micrometers. The isolating groove 21 extends without dead ends so that an etchant, which is described below, flows along the isolating groove 21. Preferably, the isolating grooves 21 are laid out in a grid.

By setting the distance between the isolating grooves at several tens of micrometers to several hundred micrometers, the size of each individual semiconductor device 13 obtained by the isolation with the isolating grooves 21 is several tens of micrometers to several hundred micrometers square. In order to form the isolating grooves 21, photolithography and wet etching may be used, or photolithography and dry etching may be used. Additionally, U-shaped isolating grooves 21 may be formed by dicing to such an extent that cracking does not occur in the substrate 10.

When the isolating grooves 21 are formed, in wet etching, a sulfuric acid-based etchant may be used, and in dry etching, chlorine gas may be used. With respect to the isolating grooves 21, since the pattern size is large and accuracy is not required, an etching mask may be formed without using photolithography. For example, an etching mask may be formed by offset printing. When the isolating grooves 21 are formed, the orientation of the isolating grooves 21 relative to the crystal orientation of the substrate 10 is also important.

<Step 3>

Figure 3:
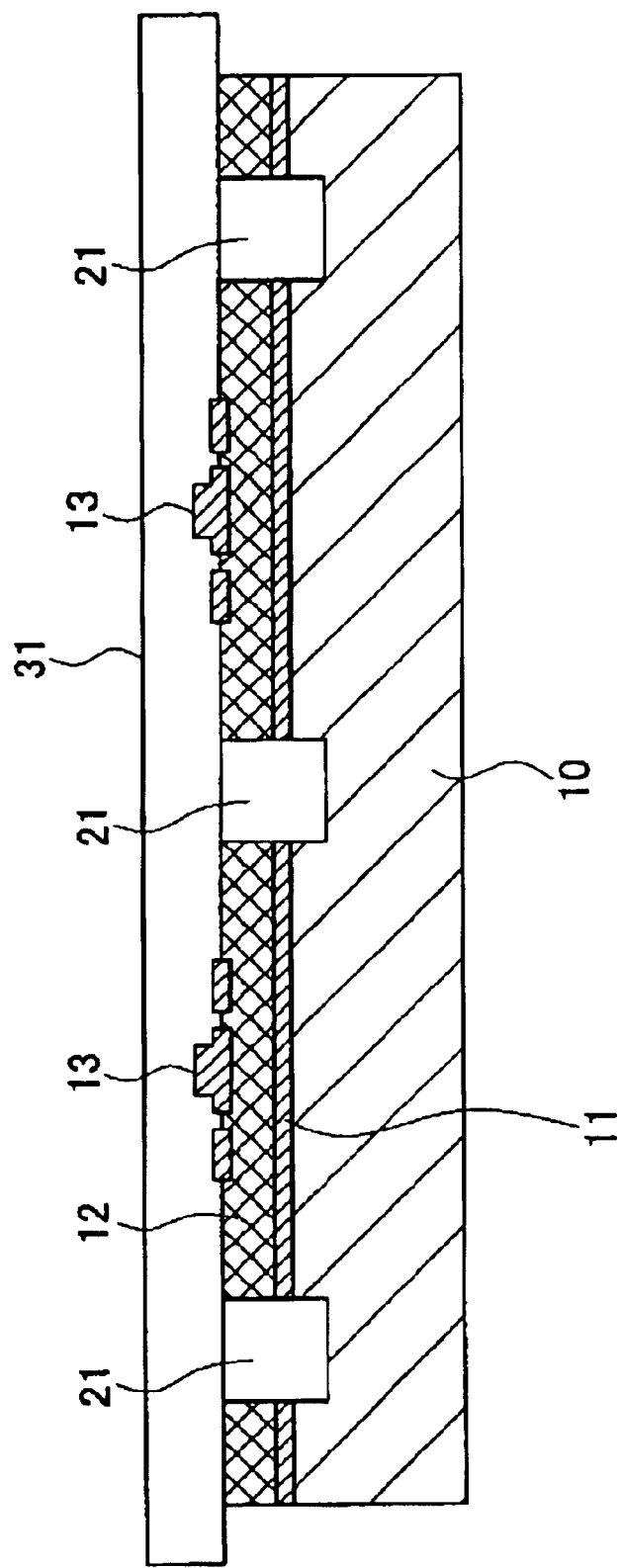
FIG. 3 is a sectional side elevational view of a substantial part which shows step 3 in the fabrication method in the exemplary embodiment.

In step 3, as shown in FIG. 3, an intermediate transfer film 31 is bonded to a surface (the surface provide with the semiconductor devices 13) of the functional layer 12 on the substrate 10. As the intermediate transfer film 31, a flexible film in which an adhesive is applied to one surface is used.

<Step 4>

Figure 4:
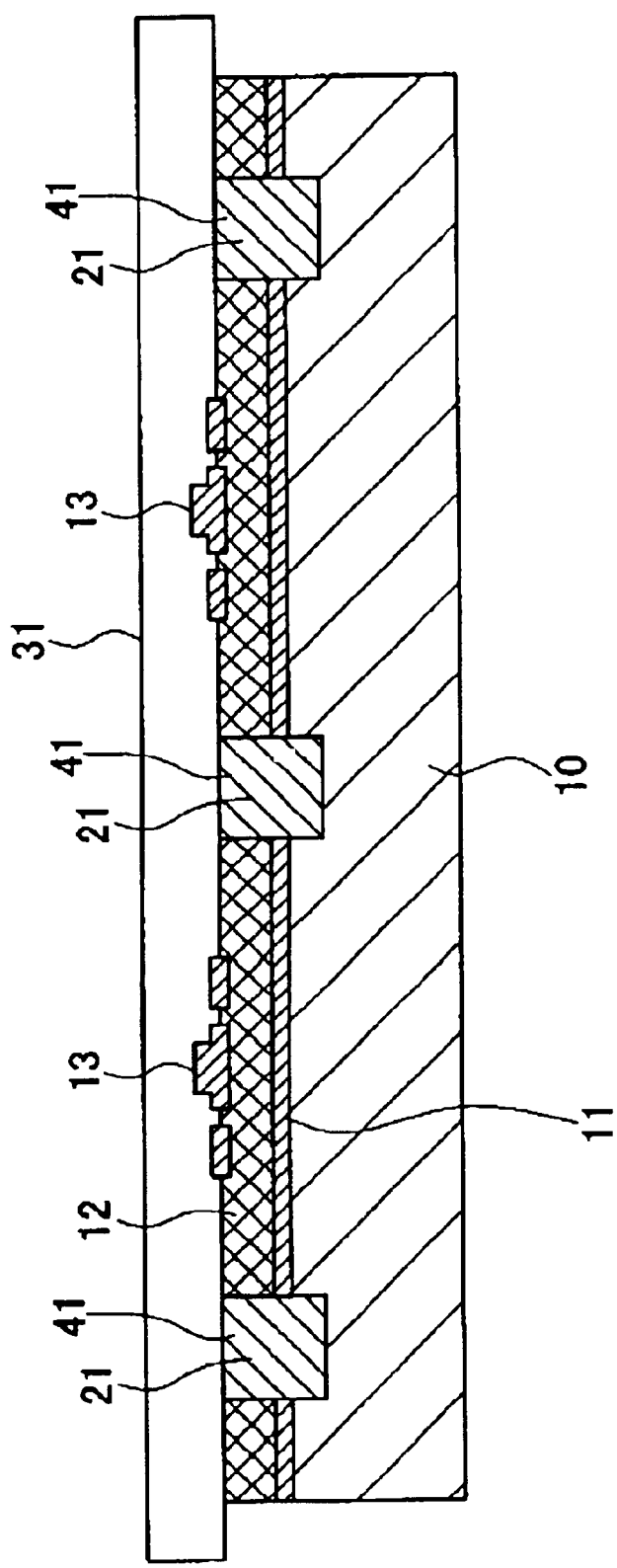
FIG. 4 is a sectional side elevational view of a substantial part which shows step 4 in the fabrication method in the exemplary embodiment.

In step 4, as shown in FIG. 4, an etchant 41 is placed into the isolating grooves 21 to selectively etch the sacrificial layer 11. During that time, the front surface or the back surface of the substrate 10 is irradiated with light with a wavelength of 1.5 $\mu$m or less, for example, using a halogen lamp (not shown in the drawing).

In this step, since only the sacrificial layer 11 is selectively etched, as the etchant 41, dilute hydrochloric acid which has high selectivity to aluminum arsenide, specifically, dilute hydrochloric acid in an amount of 0.01% to 5% by weight, is used. If the amount exceeds 5% by weight, the selective etching ratio is decreased and handling properties are degraded. If the amount is less than 0.01% by weight, the etching rate becomes low. Additionally, although hydrofluoric acid with a low concentration may be used as the etchant 41, hydrochloric acid is preferably used because of its superior selectivity.

If etching is performed using such an etchant 41 while applying light, although the mechanism is unclear, as shown in the example below, a sufficiently high selective etching ratio to the functional layer 12 is ensured. Consequently, by performing etching for a predetermined period of time, the sacrificial layer 11 can be selectively etched without damaging the semiconductor devices 13 provided on the functional layer 12.

The lamp used for irradiation is not limited to the halogen lamp, and any other lamp, such as the one which can emit light with a wavelength shorter than that of the halogen lamp, may be used.

<Step 5>

Figure 5:
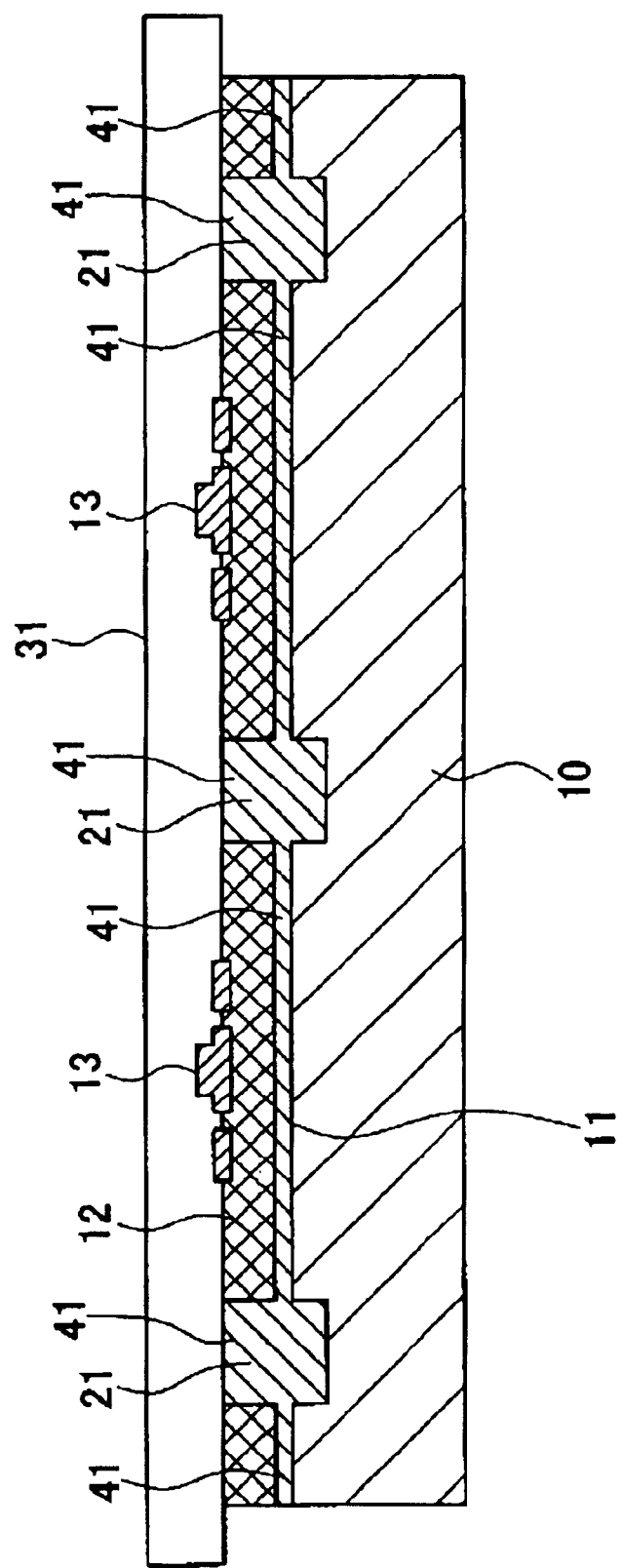
FIG. 5 is a sectional side elevational view of a substantial part which shows step 5 in the fabrication method in the exemplary embodiment.

After the entire sacrificial layer 11 is selectively etched by performing etching combined with irradiation for a predetermined period of time as shown in FIG. 5, in step 5, pure water is placed into the sections in which the isolating grooves 21 and the sacrificial layer 11 have been located, followed by rinsing.

<Step 6>

Figure 6:
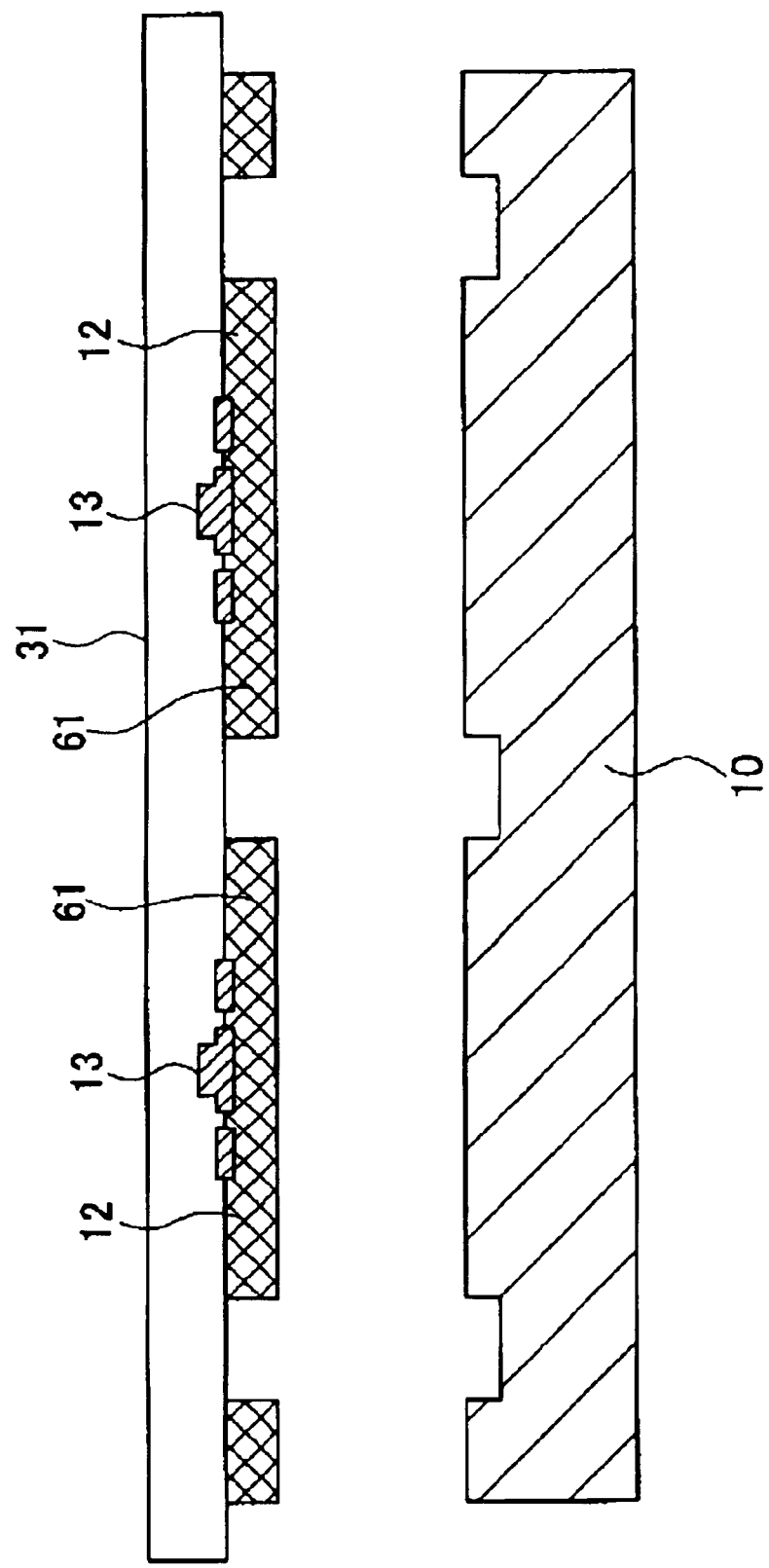
FIG. 6 is a sectional side elevational view of a substantial part which shows step 6 in the fabrication method in the exemplary embodiment.

When the sacrificial layer 11 is etched completely, the functional layer 12 is separated from the substrate 10. After the entire sacrificial layer 11 is etched, followed by rinsing, in step 6, by detaching the intermediate transfer film 31 from the substrate 10, as shown in FIG. 6, the functional layer 12 bonded to the intermediate transfer film 31 is detached from the substrate 10.

Thereby, the functional layer 12 provided with the semiconductor devices 13 are divided by the isolating grooves 21 and etching of the sacrificial layer 11, and semiconductor elements with a predetermined shape (e.g., in a microtile shape) (hereinafter "microtile elements 61") are formed, which are bonded to and held by the intermediate transfer film 31. Preferably, the microtile element 61 has a thickness of, for example, 1 to 8 μm and a size of, for example, several tens of micrometers to several hundred micrometers square.

Additionally, the substrate 10 from which the functional layer 12 has been detached can be reused to form semiconductor devices. By preliminarily forming a plurality of sacrificial layers 11 and a plurality of functional layers 12 and by repeating steps 1 to 6, it is also possible to fabricate the "microtile elements 61" repeatedly using the substrate 10.

<Step 7>

Figure 7:
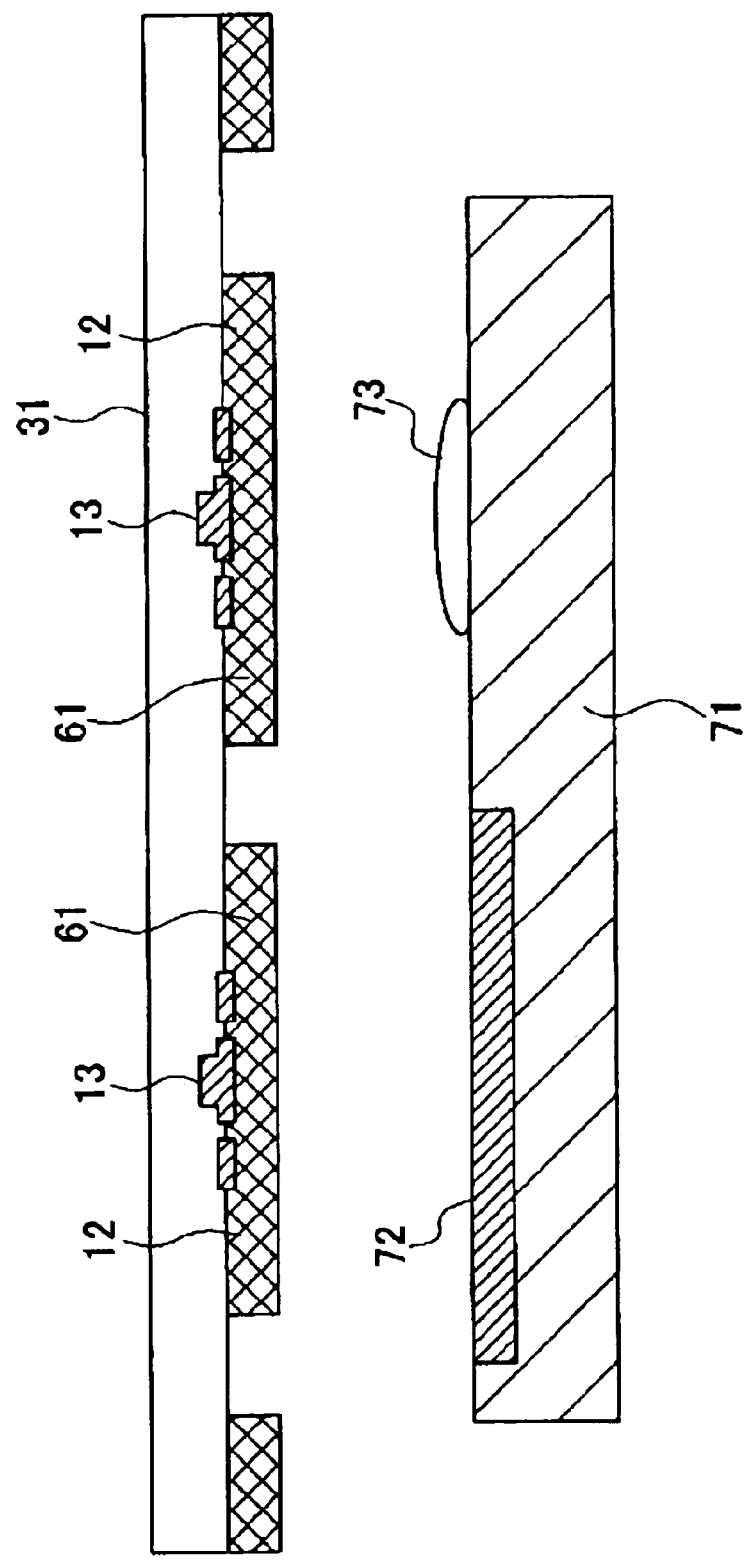
FIG. 7 is a sectional side elevational view of a substantial part which shows step 7 in the fabrication method in the exemplary embodiment.

In step 7, as shown in FIG. 7, the intermediate transfer film 31 to which the microtile element 61 has been bonded is moved and the microtile element 61 is aligned with a predetermined position of a second substrate 71. The second substrate 71 is composed of a silicon semiconductor and is provided with an LSI region 72. The LSI region 72 is provided with a circuit including various types of semiconductor elements. The predetermined position of the second substrate 71 is preliminarily applied with an adhesive 73 for adhering to the microtile element 61.

<Step 8>

Figure 8:
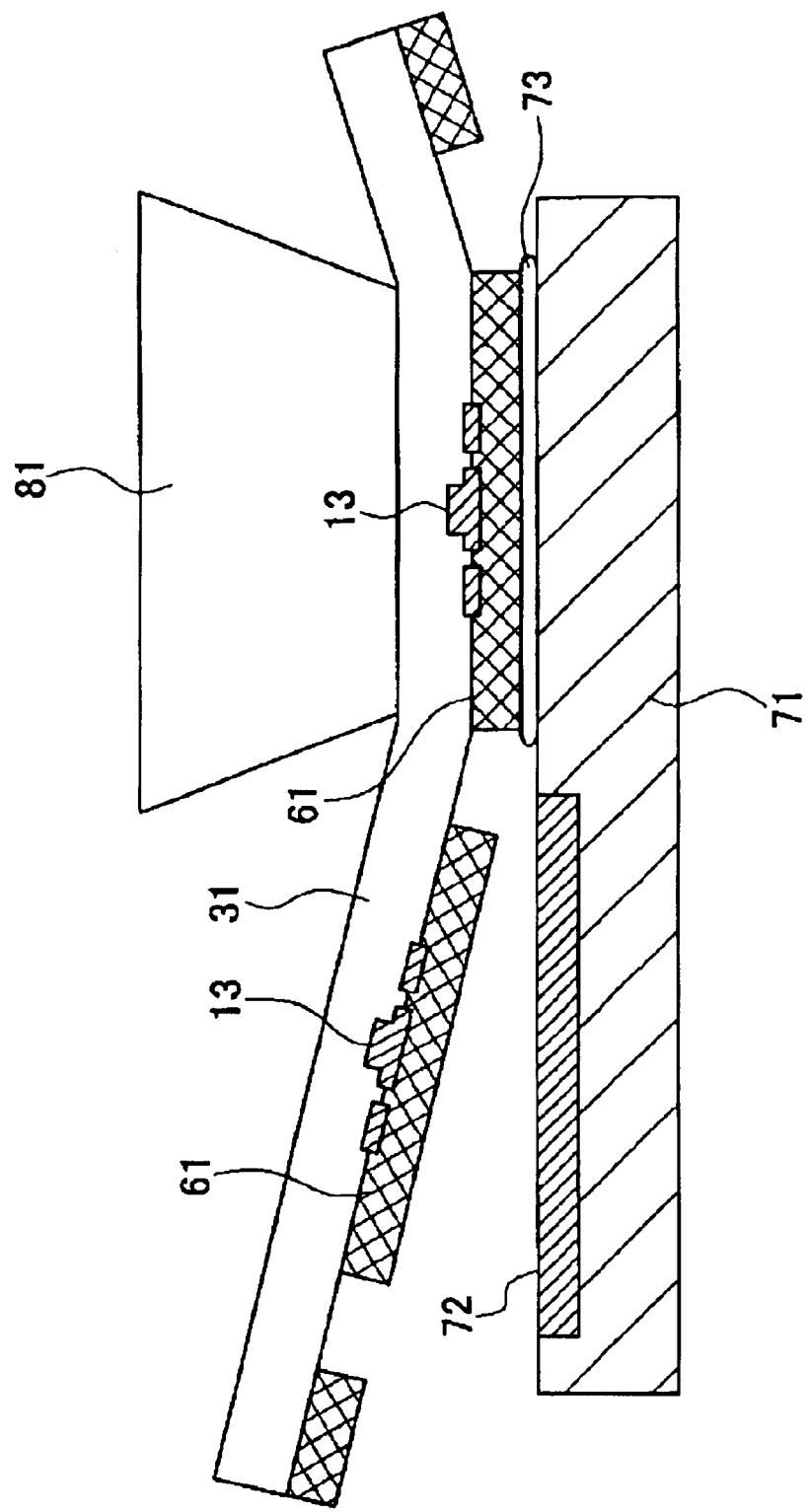
FIG. 8 is a sectional side elevational view of a substantial part which shows step 8 in the fabrication method in the exemplary embodiment.

In step 8, as shown in FIG. 8, the microtile element 61 aligned with the predetermined position of the second substrate 71 is pressed through the intermediate transfer film 31 with a back pressing pin 81 to be joined to the second substrate 71. Since the adhesive 73 is applied to the predetermined position, the microtile element 61 is bonded to the predetermined position of the second substrate 71. Although the adhesive is used to fix the microtile element 61 to the second substrate 71 in this step, any other fixing method may be used.

<Step 9>

Immediately after step 6, the adhesion of the intermediate transfer film 31 is made ineffective to detach the intermediate transfer film 31 from the microtile element 61.

As the adhesive for the intermediate transfer film 31, a UV cure or thermosetting adhesive is used. Immediately after step 6, the adhesion of the intermediate transfer film 31 is made ineffective entirely by irradiating the intermediate transfer film 31 entirely with ultraviolet light or the like. Even if the adhesion is made ineffective, in practice, a slight tackiness remains, and since the microtile element 61 is extremely thin and light, the microtile element 61 remains bonded to the intermediate transfer film 31. When a UV cure adhesive is used, by using a back pressing pin 81 composed of a transparent material and applying (transmitting) ultraviolet (UV) light through the edge (bottom face) of the back pressing pin 81, the adhesion of the intermediate transfer film 31 may be made ineffective. On the other hand, when a thermosetting adhesive is used, by heating the back pressing pin 81, the adhesion of the intermediate transfer film 31 may be made ineffective.

Figure 9:
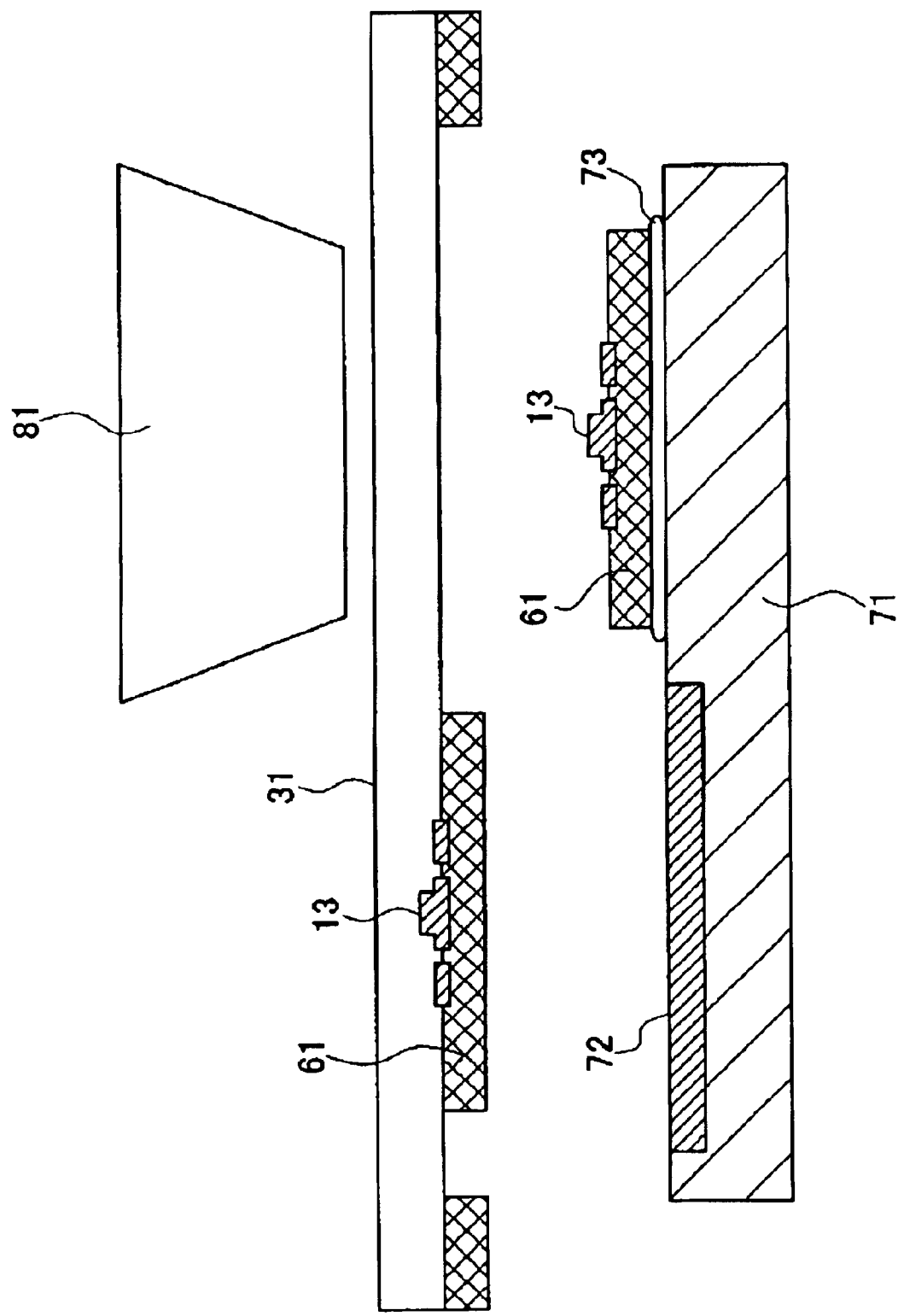
FIG. 9 is a sectional side elevational view of a substantial part which shows step 9 in the fabrication method in the exemplary embodiment.

By preliminarily detaching the intermediate transfer film 31 from the microtile element 61 as described above, in step 9, as shown in FIG. 9, the microtile element 61 transfers to the predetermined position of the second substrate 71.

<Step 10>

In step 10, the adhesive 73 is hardened by heating or the like to bond the microtile element 61 to the second substrate 71.

<Step 11>

Figure 10:
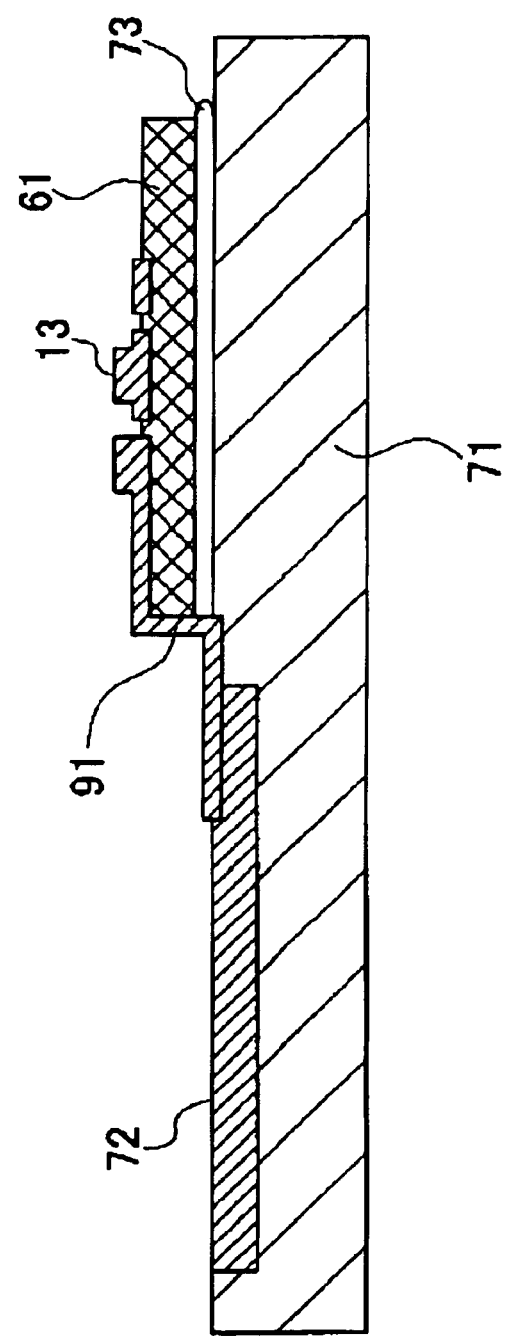
FIG. 10 is a sectional side elevational view of a substantial part which shows step 11 in the fabrication method in the exemplary embodiment.

In step 11, as shown in FIG. 10, the electrode of the microtile element 61 and the circuit on the second substrate 71 are electrically connected to each other by an interconnection line 91 to produce an LSI chip.

As the second substrate 71, instead of the silicon semiconductor, a substrate composed of any one of quartz, sapphire, a metal, a ceramic, and a plastic film may be used. When a silicon semiconductor is used for the second substrate 71, the substrate may be provided with a CCD (charge-coupled device). When the second substrate 71 is composed of glass, such as quartz, the substrate may be used for a liquid crystal display (LCD), a display for an organic EL apparatus, or the like. When the second substrate 71 is composed of a plastic film, the substrate may be used for a liquid crystal display, an organic electroluminescent panel, an IC film package, or the like.

In accordance with the fabrication method described above, since the sacrificial layer 11 is composed of an N-type Al(x1)Ga(1-x1)As layer with a higher Al content and a lower Ga content as compared with the functional layer 12 and the sacrificial layer 11 is etched using dilute hydrochloric acid as the etchant while applying light, a sufficiently high selective etching ratio is ensured. Consequently, an epitaxial lift-off process can be performed satisfactorily without damaging the semiconductor device 13, and the functional layer 12 is thereby detached from the substrate 10 satisfactorily.

It is also possible to form the semiconductor device 13 on the second substrate 71 (semiconductor substrate) as if the semiconductor device 13 was monolithically formed on the second substrate 71, the combination being impossible in the conventional monolithic process.

That is, when a semiconductor element is formed on a substrate composed of a different material, such as a case in which a surface-emitting laser, photodiode, or high electron mobility transistor composed of gallium arsenide is disposed on a silicon semiconductor substrate, or a case in which silicon microtransistors, instead of thin-film transistors (TFTs), for the individual pixels of a liquid crystal display are bonded to a glass substrate, a hybrid process is used in the related art.

Figure 17:
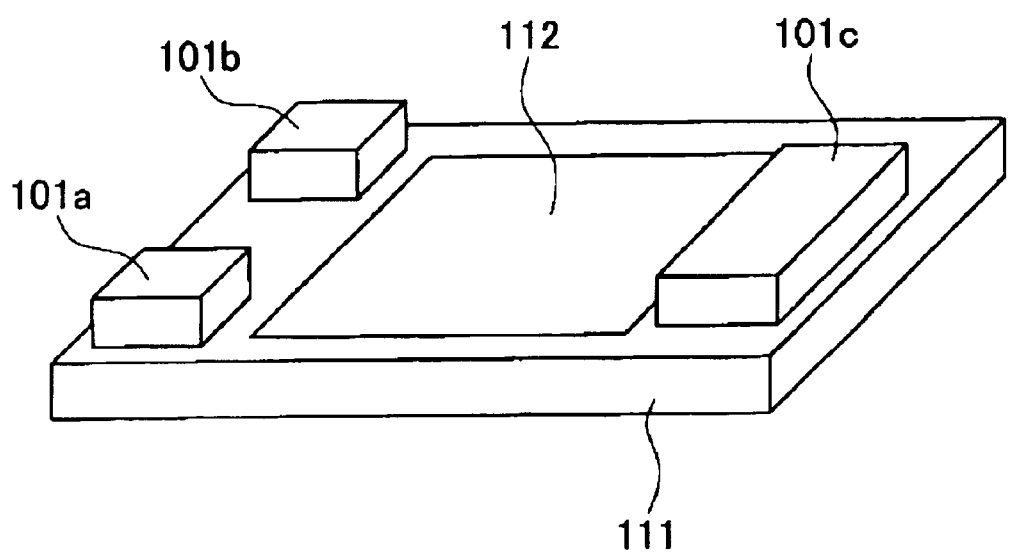
FIG. 17 is a perspective view which shows a related art hybrid integrated circuit.

FIG. 17 is a perspective view which schematically shows a related art hybrid integrated circuit. As shown in FIG. 17, a silicon LSI chip 111 includes an LSI region 112. A photodiode chip 101a, a surface-emitting laser chip 101b, and a high mobility transistor chip 101c are joined to a surface of the silicon LSI chip 111. In the related art mounting technique, the limit of the chip size which can be handled is several tens of micrometers in thickness×several hundred micrometers square in area. Therefore, the size of each of the photodiode chip 101a, the surface-emitting laser chip 101b, and the high mobility transistor chip 101c is at least several tens of micrometers in thickness×several hundred micrometers square in area.

Figure 11:
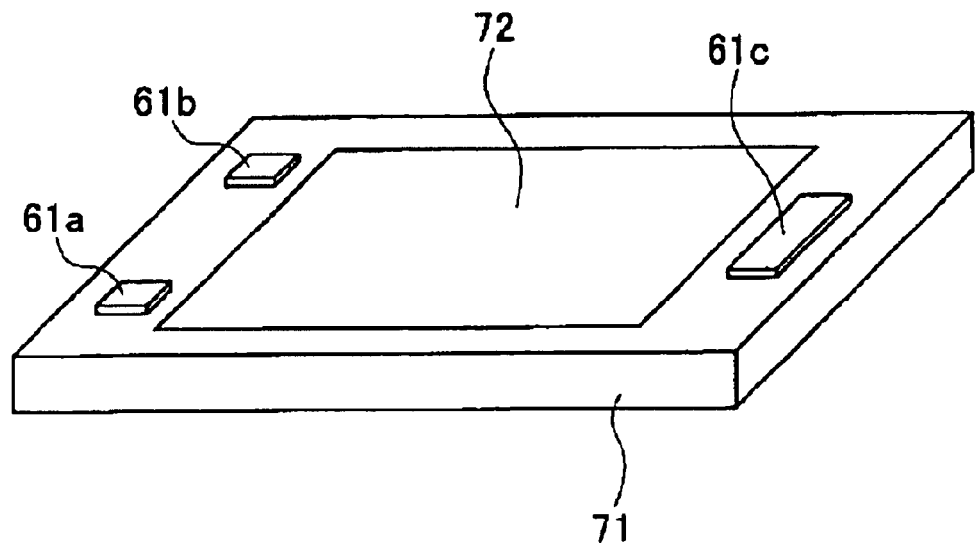
FIG. 11 is a perspective view which schematically shows an integrated circuit fabricated by a fabrication method of the present invention.

In contrast, in accordance with the fabrication method in this exemplary embodiment, as described above, the semiconductor devices 13 (microtile elements 61) can be formed on the second substrate (semiconductor substrate) 71 as if they were monolithically formed as shown in FIG. 11. That is, in FIG. 11, a silicon LSI chip which corresponds to the second substrate 71 includes an LSI region 72. A photodiode tile 61a, a surface-emitting laser tile 61b, and a high-speed transistor (e.g., MESFET, HBT, or HEMT) 61c are joined to a surface of the second substrate 71. The HBT stands for a compound semiconductor heterojunction bipolar transistor. Herein, the photodiode tile 61a, the surface-emitting laser tile 61b, and the high-speed transistor 61c are fabricated and bonded to the substrate 71 by the method in accordance with the embodiment. Consequently, the size of each of the photodiode tile 61*a*, the surface-emitting laser tile 61*b*, and the high-speed transistor 61*c* can be set at several micrometers in thickness×several tens of micrometers square in area.

In accordance with the fabrication method in this exemplary embodiment, it is possible to form a semiconductor element (microtile element 61) which is as small as a monolithically formed element on any type of substrate (e.g., silicon, quartz, sapphire, metal, ceramic, or plastic film substrate).

In accordance with the fabrication method in this exemplary embodiment, the semiconductor devices (semiconductor elements) 13 are completed on the semiconductor substrate (substrate 10), and then are formed into the microtile elements 61. Consequently, with respect to the semiconductor devices 13, it is possible to preliminarily check the quality by conducting an operation test.

The entire semiconductor substrate (substrate 10) except for the portions corresponding to the isolating grooves 21 can be used as the semiconductor devices 13 (microtile elements 61). Consequently, it is possible to improve the area utilization factor, resulting in a reduction in fabrication cost.

Since the microtile elements 61 are mounted on the flexible intermediate transfer film 31, the individual microtile elements 61 can be selectively bonded to the second substrate 71.

Since the microtile elements 61 as the finished semiconductor elements are bonded to the second substrate 71, a complex semiconductor process is not required after bonding. Consequently, it is not necessary to process the entire second substrate 71 after the microtile elements 61 are bonded to the second substrate 71, and therefore, the fabrication process can be streamlined.

Since a complex semiconductor process is not required after the microtile elements 61 are bonded to the second substrate 71, restrictions on the bonding method for the microtile elements 61 are eased, and for example, a low heat resistance bonding method may be employed.

In the exemplary embodiment described above, the surface-emitting laser is chosen as the semiconductor device 13 formed on the functional layer 12. The present invention is not limited thereto, and a light-emitting diode (LED), a photodiode (PD), a high electron mobility transistor (HEMT), a heterojunction bipolar transistor (HBT), or the like may be chosen. Alternatively, a plurality of types of devices selected from the above and the surface-emitting laser may be formed.

(Exemplary Applications)

Next, exemplary applications of a semiconductor element composite fabricated using the fabrication method of the semiconductor device of the present invention are described below.

In a first exemplary application, a surface-emitting laser (VCSEL) and a photodiode (PD) are disposed on a silicon LSI using the method described above in the exemplary embodiment. As a result, it becomes possible to send or receive data to or from the outside of the silicon LSI using an optical pulse. Consequently, it is possible to send or receive data to or from a place where an electrical connection is not available, and it is also possible to send or receive signals faster than the case in which electrical signals are sent or received.

In a second exemplary application, a high-speed transistor (HBT) is disposed on a silicon LSI using the method described above in the exemplary embodiment. By incorporating a high-speed analog amplifier using the HBT in the silicon IC as a component for a mobile phone or the like, the interconnection length is decreased, and high-speed operation of the circuit is enabled. With respect to the substrate 10 for fabricating the microtile elements 61, the entire substrate except for the portions corresponding to the isolating grooves 21 can be used as the semiconductor devices 13 (microtile elements 61). Consequently, it is possible to enhance the area utilization factor of the expensive gallium arsenide substrate, resulting in a reduction in fabrication cost.

In a third exemplary application, in the pixels of a liquid crystal display which is an electro-optical apparatus, instead of thin-film transistors (TFTs), silicon microtransistors are bonded using the fabrication method of the present invention.

In a fourth exemplary application, in the pixels of an organic EL (electroluminescent) display which is an electro-optical apparatus, instead of thin-film transistors (TFTs), silicon microtransistors are bonded using the fabrication method of the present invention. The method of fabricating the electro-optical apparatus is described in detail below.

(Exemplary Electro-Optical Apparatus)

Exemplary electro-optical apparatus in the application of the exemplary embodiment is described with reference to FIG. 12.

Figure 12:
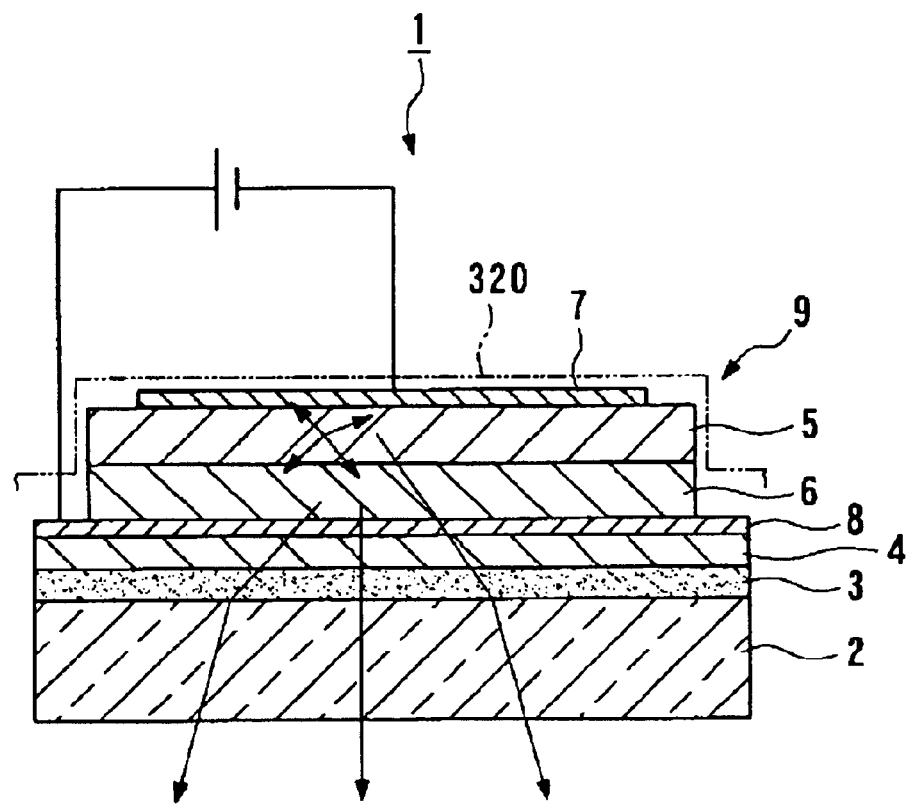
FIG. 12 is a sectional view which schematically shows an electro-optical apparatus in an exemplary embodiment of the present invention.

In FIG. 12, reference numeral 1 represents an organic EL apparatus. The organic EL apparatus 1 includes a light-transmissible substrate (light transmission layer) 2, an organic EL element (luminescent element) 9 including a luminescent layer 5 composed of an organic electroluminescent material which is provided on a surface of the substrate 2 and which is interposed between a cathode (negative electrode) 7 and an anode (positive electrode) 8, and a hole-transporting layer 6, and optionally, a low refractive index layer 3 and a sealing layer 4 deposited between the substrate 2 and the organic EL element 9. The low refractive index layer 3 is closer to the substrate 2 than the sealing layer 4.

In the organic EL apparatus 1, a sealing member 320, which intercepts the atmosphere from entering the organic EL element 9 including the electrodes 7 and 8, is also disposed on a surface of the organic EL element 9 at the side opposite to the sealing layer 4 side.

The organic EL apparatus 1 having such a structure is fabricated by forming the positive electrode 8 on the sealing layer 4 by sputtering, ion plating, vacuum deposition, or the like, and by vapor-depositing the hole-transporting layer 6, the luminescent layer 5, and the negative electrode 7 in that order on the positive electrode 8.

In the organic EL apparatus 1 shown in FIG. 12, the radiation from the luminescent layer 5 is taken through the substrate 2. Examples of materials for the substrate 2 include light-transmissible transparent or translucent materials, such as transparent glass, quarts, sapphire, and transparent synthetic resins, e.g., polyesters, polyacrylates, polycarbonate, and polyether ketones.

On the other hand, in a structure in which the radiation is taken through a side opposite to the substrate side, the substrate may be opaque. In such a case, a ceramic, such as alumina, a metal sheet, e.g., a stainless steel sheet, which is subjected to insulation treatment, such as surface oxidation, a thermosetting resin, a thermoplastic resin, or the like may be used.

The positive electrode 8 is a transparent electrode composed of indium tin oxide (ITO) or the like. The hole-transporting layer 6 is composed of, for example, a triphenylamine derivative (TPD), a pyrazoline derivative, an arylamine derivative, a stilbene derivative, or a triphenyldiamine derivative. Specific examples thereof are disclosed in Japanese Unexamined Patent Application Publication Nos. 63-70257, 63-175860, 2-135359, 2-135361, 2-209988, 3-37992, 3-152184, etc. Preferably, a triphenyldiamine derivative is used, and more preferably, 4,4'-bis(N(3-methylphenyl)-N-phenylamino)biphenyl is used.

Additionally, instead of the hole-transporting layer, a hole injection layer may be formed. Moreover, both a hole injection layer and a hole-transporting layer may be formed. In such a case, as the material for the hole injection layer, for example, copper phthalocyanine (CuPc), polyphenylenevinylene which is polytetrahydrothiophenylphenylene, 1,1-bis-(4-N,N-ditolylaminophenyl)cyclohexane, or tris(8-hydroxyquinolinol)aluminum is used. Preferably, copper phthalocyanine (CuPc) is used.

Examples of the material for the luminescent layer 5 include monomeric organic luminescent pigments and polymeric phosphors, i.e., various types of light-emitting materials, such as fluorescent materials and phosphorescent materials, and organic electroluminescent materials, such as Alq3 (aluminum chelate complex). Among the conjugated polymers which function as light-emitting materials, arylenevinylene or a material containing a polyfluorene structure is particularly preferred. Examples of monomeric phosphors for use include: pigments, such as naphthalene derivatives, anthracene derivatives, perylene derivatives, polymethines, xanthenes, coumarins, and cyanines; metal complexes of 8-hydroquinoline or its derivatives; aromatic amines; tetraphenylcyclopentadiene derivatives; and other related art, later developed or known materials disclosed in Japanese Unexamined Patent Application Publication Nos. 57-51781, 59-194393, etc.

The negative electrode 7 is a metal electrode composed of aluminum (Al), magnesium (Mg), gold (Au), silver (Ag), or the like.

Additionally, an electron-transporting layer and an electron injection layer may be provided between the negative electrode 7 and the luminescent layer 5. The material for the electron-transporting layer is not particularly limited, and examples of the material used include oxadiazole derivatives, anthraquinodimethane and derivatives thereof, benzoquinone and derivatives thereof, naphthoquinone and derivatives thereof, anthraquinone and derivatives thereof, tetracyanoanthraquinodimethane and derivatives thereof, fluorenone derivatives, diphenyldicyanoethylene and derivatives thereof, diphenoquinone derivatives, and metal complexes of 8-hydroxyquinoline or its derivatives. As in the case of the material for the hole-transporting layer, specific examples thereof are disclosed in Japanese Unexamined Patent Application Publication Nos. 63-70257, 63-175860, 2-135359, 2-135361, 2-209988, 3-37992, 3-152184, etc. In particular, 2-(4-biphenyl)-5-(4-t-butylphenyl)-1,3,4-oxadiazole, benzoquinone, anthraquinone, and tris(8-quinolinol)aluminum are preferred.

Figure 13:
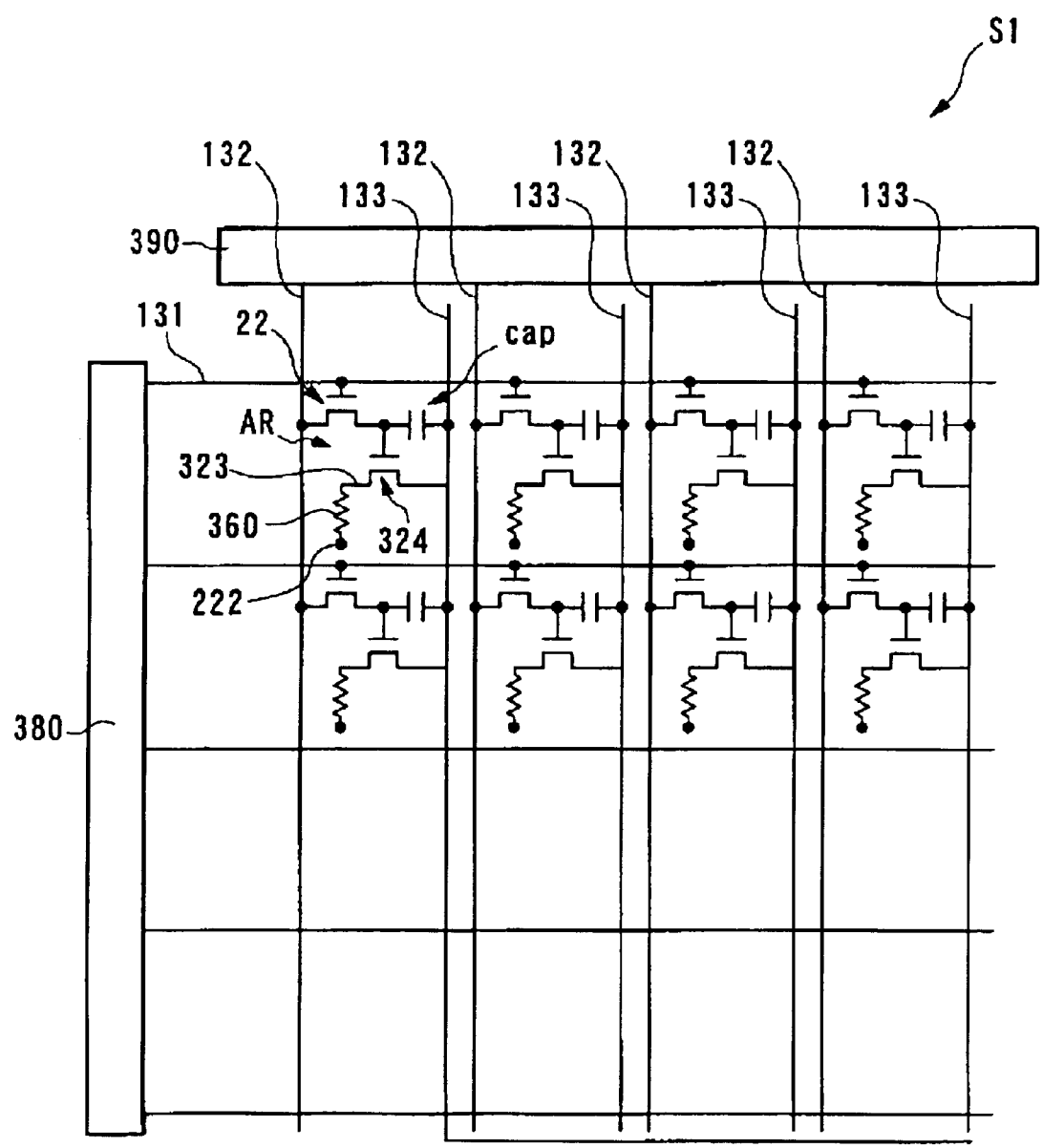
FIG. 13 is a schematic circuit diagram which shows an active matrix display.

The organic EL apparatus 1 having the structure described above is, for example, used as an active matrix display (electro-optical apparatus) S1 shown in FIG. 13.

As shown in FIG. 13 which is a circuit diagram, in the display S1, a plurality of scanning lines 131, a plurality of signal lines 132 extending in a direction orthogonal to the scanning lines 131, and a plurality of common feeders 133 extending parallel to the signal lines 132 are arrayed on a substrate. At each of the intersections between the scanning lines 131 and the signal lines 132, a pixel (pixel area) AR is disposed.

A data line drive circuit 390 including a shift register, a level shifter, a video line, and an analog switch is provided for the signal lines 132.

On the other hand, a scanning line drive circuit 380 including a shift register and a level shifter is provided for the scanning lines 131. Each pixel area AR includes: a first transistor 322 in which scanning signals are supplied to the gate electrode through the scanning line 131, a hold capacitor cap which holds image signals supplied from the signal line 132 through the first transistor 322, a second transistor 324 in which the image signals held by the hold capacitor cap are supplied to the gate electrode, a pixel electrode 323 in which a driving current flows from the common feeder 133 when electrically connected to the common feeder 133 through the second transistor 324, and a luminescent section (luminescent layer) 360 sandwiched between the pixel electrode (positive electrode) 323 and a counter electrode (negative electrode) 222.

Herein, the first transistor 322 and the second transistor 324 are silicon microtransistors which are bonded onto the substrate of the display S1 in accordance with steps 1 to 11 of the fabrication method described above.

In such a construction, when the scanning line 131 is driven and the first transistor 322 is turned on, the electric potential of the signal line 132 is held in the hold capacitor cap. The continuity of the second transistor 324 depends on the state of the hold capacitor cap. A current is applied to the pixel electrode 323 from the common feeder 133 through the channel of the second transistor 324, and furthermore, the current flows to the counter electrode 222 through the luminescent layer 360. The luminescent layer 360 emits light in response to the current flowing therethrough.

(Exemplary Electronic System)

Examples of electronic systems including the electro-optical apparatus in the exemplary embodiment described above are described below.

Figure 14:
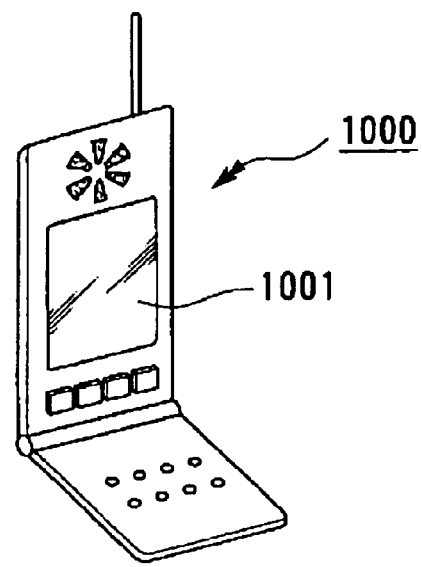
FIG. 14 is a perspective view which shows a mobile phone as an electronic system including an electro-optical apparatus of the present invention.

FIG. 14 is a perspective view showing a mobile phone. In FIG. 14, reference numeral 1000 represents a mobile phone body and reference numeral 1001 represents a display unit using the display (electro-optical apparatus) described above.

Figure 15:
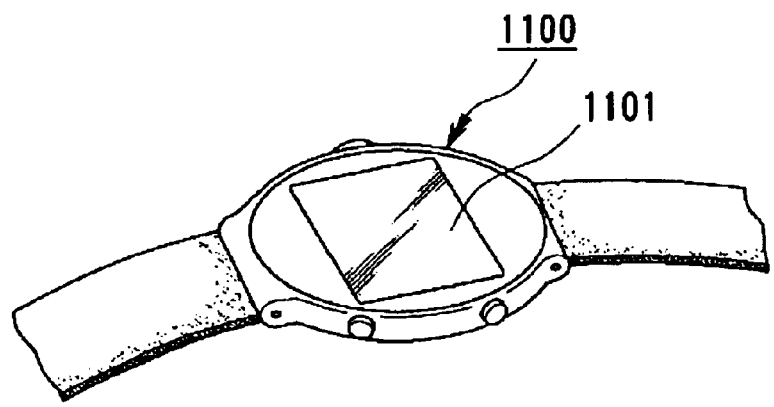
FIG. 15 is a perspective view which shows a wristwatch-type electronic system as an electronic system including an electro-optical apparatus of the present invention.

FIG. 15 is a perspective view showing a wristwatch-type electro-optical apparatus. In FIG. 15, reference numeral 1100 represents a watch body and reference numeral 1101 represents a display unit using the display (electro-optical apparatus) described above.

Figure 16:
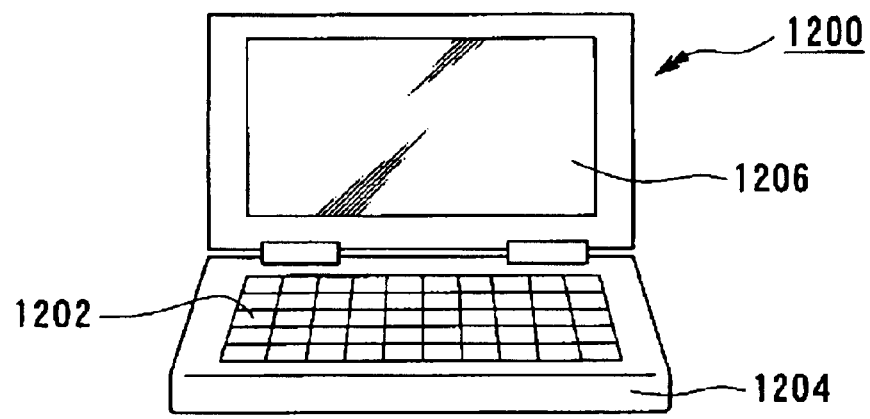
FIG. 16 is a perspective view which shows a mobile information processor as an electronic system including an electro-optical apparatus of the present invention.

FIG. 16 is a perspective view showing a mobile information processor, such as a word processor or personal computer. In FIG. 16, reference numeral 1200 represents an information processor, reference numeral 1202 represents an input unit, such as a keyboard, reference numeral 1204 represents an information processor body, and reference numeral 1206 represents a display unit using the display (electro-optical apparatus) described above.

Each of the electronic systems shown in FIGS. 14 to 16 exhibits high reliability because it includes the display (electro-optical apparatus) described above.

Since the electronic system is fabricated in accordance with the method of the exemplary embodiment, further miniaturization is enabled and the fabrication cost can be reduced compared to the related art system.

The technical field of the present invention is not limited to the exemplary embodiments described above. Various alterations can be made within the scope not deviating from the scope of the present invention. The specific materials and the layer structures described in the exemplary embodiments are merely examples and various modifications can be made.

EXAMPLES

The following four samples were prepared, each including a layer composed of $Al_{(x)}Ga_{(1-x)}As$.

N-type aluminum gallium arsenide layer in which x=0.9
P-type aluminum gallium arsenide layer in which x=0.9
N-type aluminum arsenide layer in which x=1.0
P-type aluminum arsenide layer in which x=1.0

As an etchant, 0.1% by weight of dilute hydrochloric acid was prepared.

Each of the four samples was etched using the etchant. The etching process was performed under the two conditions, i.e., under irradiation with a halogen lamp and in a dark box without irradiation.

The etching rate ($\mu$m/min) to each sample (each layer) was measured under the individual conditions. The results thereof are shown in Table 1 below.

TABLE 1

|  | Etching rate under irradiation ($\mu$m/min) | Etching rate without irradiation ($\mu$m/min) |
| --- | --- | --- |
| N-type x = 1.0 | 1.3 | 0.3 |
| P-type x = 1.0 | 0.05 | 0.7 |
| N-type x = 0.9 | 0.01 | 0.01 |
| P-type x = 0.9 | 0.0065 | 0.03 |

Based on the results shown in Table 1, the ratio of the etching rate of the layer with x being 1.0 to the etching rate of the layer with x being 0.9, i.e., the selective etching ratio, was calculated. The results thereof are shown in Table 2.

TABLE 2

|  | Selective etching ratio under irradiation | Selective etching ratio without irradiation |
| --- | --- | --- |
| N-type x = 1.0 to N-type x = 0.9 | 130 | 30 |
| N-type x = 1.0 to P-type x = 0.9 | 200 | 10 |
| P-type x = 1.0 to N-type x = 0.9 | 5 | 70 |
| P-type x = 1.0 to P-type x = 0.9 | 7.7 | 23 |

As is evident from Table 2, when the N-type layer in which x=1.0 is etched using dilute hydrochloric acid as the etchant while being irradiated with light, a selective etching ratio of 100 or more is shown to each of the N-type layer in which x=0.9 and the P-type layer in which x=0.9.

The etching rate of AlGaAs with respect to hydrochloric acid decreases as the Al content x decreases. Consequently, the N-type layer in which x=1.0 naturally has a selective etching ratio of 100 or more to a layer in which the Al content x is 0.9 or less under the same condition. In general, if the selective etching ratio of the sacrificial layer to the functional layer is approximately 100, it is possible to selectively remove the sacrificial layer without damaging the functional layer.

In the functional layer including a layer in which x=0.9 at maximum as in the surface-emitting laser described in the embodiment, by using an N-type layer in which x=1.0 as the sacrificial layer and performing an etching process using dilute hydrochloric acid as the etchant under irradiation, it is possible to selectively etch the sacrificial layer only without substantially damaging the functional layer.

The similar selective etching ratio was obtained with respect to hydrochloric acid or hydrofluoric acid with a concentration of 0.01% to 5% by weight used as the etchant. As the concentration is decreased, the selective etching ratio is increased. Therefore, preferably, the concentration is set at 3% by weight or less. Since the etching rate of the sacrificial layer is decreased as the concentration is decreased, more preferably, the concentration is set at 0.05% by weight or more.

In the sacrificial layer, most preferably x=1.0. Even if x<1.0, if the Al content is higher than the Al content of a layer with the maximum Al content included in the functional layer by at least 10%, the same selective etching ratio as that described above can be obtained.

However, if the Al content of the sacrificial layer is excessively low, the etching rate decreases and it takes a long time to etch the sacrificial layer. Therefore, in practice, preferably x$\geq$0.95.

[Advantages]

As described above, in accordance with the present invention, even when a layer having a high Al content is used as the functional layer, by using, as the sacrificial layer, an N-type Al(x1)Ga(1-x1)As layer with a higher Al content and a lower Ga content as compared with the functional layer, and by etching the sacrificial layer using dilute hydrochloric acid or hydrofluoric acid as the etchant while the sacrificial layer is being irradiated with light, a sufficiently high selective etching ratio is ensured. Consequently, an epitaxial lift-off process can be performed satisfactorily without damaging the semiconductor element. The functional layer is thereby detached from the substrate satisfactorily.

Since the semiconductor element thus formed on the substrate can be detached from the substrate, for example, in a microtile shape, the detached semiconductor element in a microtile shape can be joined to a given object to form an integrated circuit.

What is claimed is:

1. A method of making a semiconductor device, comprising:

forming a functional layer provided with a semiconductor element on a substrate with a sacrificial layer therebetween; and detaching the functional layer from the substrate by etching the sacrificial layer, the sacrificial layer including an N-type Al(x1)Ga(1-x1)As layer;

the functional layer including an Al(x2)Ga(1-x2)As semiconductor layer, where x1>x2;

at least one of hydrochloric acid and hydrofluoric acid with a concentration of 0.01% to 5% by weight being used as an etchant for the sacrificial layer; and the sacrificial layer being etched by the etchant while the sacrificial layer is irradiated with light.

2. The method of making a semiconductor device according to claim 1, x1 in the sacrificial layer including the N-type Al(x1)Ga(1-x1)As layer, and x2 in the functional lay including the Al(x2)Ga(1-x2)As semiconductor layer, satisfying the relationship x1−x2$\geq$0.1.

3. The method of making a semiconductor device according to claim 1, x1 in the sacrificial layer including the N-type Al(x1)Ga(1-x1)As layer being 0.95 or more.

4. The method of making a semiconductor device according to claim 3, x1 in the sacrificial layer including the N-type Al(x1)Ga(1-x1)As layer being 1.0.

5. The method of making a semiconductor device according to claim 1, further comprising:

attaching a film to the functional layer formed on the substrate, the functional layer provided with the semiconductor element being detached from the substrate in that state.

6. The method of making a semiconductor device according to claim 1, the semiconductor element including at least one of a light-emitting diode, a surface-emitting laser, a photodiode, a high electron mobility transistor, an inductor, a capacitor, a resistor, and a heterojunction bipolar transistor.

7. The method of making a semiconductor device according to claim 1, further comprising:

forming an isolating groove in the functional layer, the sacrificial layer being etched in that state to detach the functional layer from the substrate.

8. The method of making a semiconductor device according to claim 7, the isolating groove being formed by at least one of dry etching and wet etching.

9. The method of making a semiconductor device according to claim 7, the isolating groove having a depth that reaches at least the sacrificial layer.

10. The method of making a semiconductor device according to claim 9, the sacrificial layer being etched by placing the etchant into the isolating groove to detach the functional layer from the substrate.

11. The method of making a semiconductor device according to claim 1, further comprising:

bonding the detached functional layer provided with the semiconductor element to a second substrate that is different from the substrate.

12. The method of making a semiconductor device according to claim 11, the second substrate that is different from the substrate including at least one of silicon, quartz, sapphire, metal, ceramic, and plastic films.

13. The method of making a semiconductor device according to claim 11, further comprising:

connecting the semiconductor element provided on the functional layer, which is bonded to the second substrate that is different from the substrate, to a circuit disposed on the second substrate.

* * * * *